United States Patent

Koyanagi et al.

[11] Patent Number: 5,391,918
[45] Date of Patent: Feb. 21, 1995

[54] SEMICONDUCTOR DEVICE

[75] Inventors: Masaru Koyanagi; Kazuyoshi Muraoka, both of Yokohama; Minoru Yamada, Kawasaki, all of Japan

[73] Assignee: Kabushiki Kaisha Toshiba, Kawasaki, Japan

[21] Appl. No.: 80,512

[22] Filed: Jun. 24, 1993

[30] Foreign Application Priority Data

Jun. 24, 1992 [JP] Japan .................. 4-166168

[51] Int. Cl.⁶ .................. H01L 23/48; H01L 29/44; H01L 29/52; H01L 29/60
[52] U.S. Cl. .................. 257/691; 257/776; 257/692
[58] Field of Search ............ 257/676, 691, 666, 668, 257/692, 776

[56] References Cited

U.S. PATENT DOCUMENTS

| | | | |
|---|---|---|---|
| 4,595,945 | 6/1986 | Graver | 257/676 |
| 4,937,656 | 6/1990 | Kohara | 257/676 |
| 4,967,261 | 10/1990 | Niki et al. | 357/70 |
| 5,068,712 | 11/1991 | Murakami et al. | 357/72 |
| 5,072,280 | 12/1991 | Matsukura | 257/668 |
| 5,229,639 | 7/1993 | Hansen et al. | 257/691 |
| 5,229,846 | 7/1993 | Kozuka | 257/666 |
| 5,250,840 | 10/1993 | Oh et al. | 257/676 |

FOREIGN PATENT DOCUMENTS

| | | |
|---|---|---|
| 0361825 | 4/1990 | European Pat. Off. . |
| 0400324 | 12/1990 | European Pat. Off. . |
| 0533589 | 3/1993 | European Pat. Off. . |

OTHER PUBLICATIONS

Nikkei Microdevices, Feb. 1991, pp. 89-97.

*Primary Examiner*—Andrew J. James
*Assistant Examiner*—S. V. Clark
*Attorney, Agent, or Firm*—Foley & Lardner

[57] ABSTRACT

In the semiconductor device according to the present invention, bonding pads are arranged on the periphery of the semiconductor chip and power supply inner leads are disposed inwardly of signal inner leads. Since bonding wires for connecting the signal lead to signal pads corresponding thereto do not extend astride of the power supply inner lead, a package of a semiconductor device can be thereby thinned as much as possible.

12 Claims, 4 Drawing Sheets

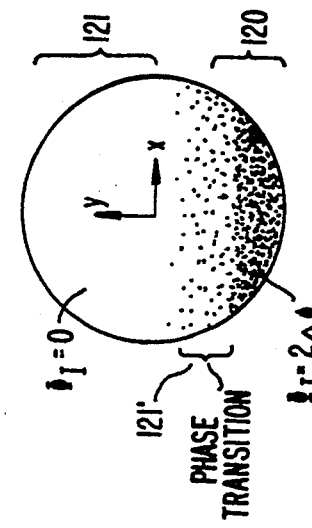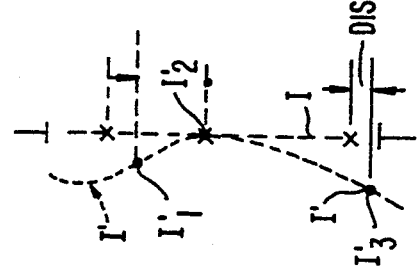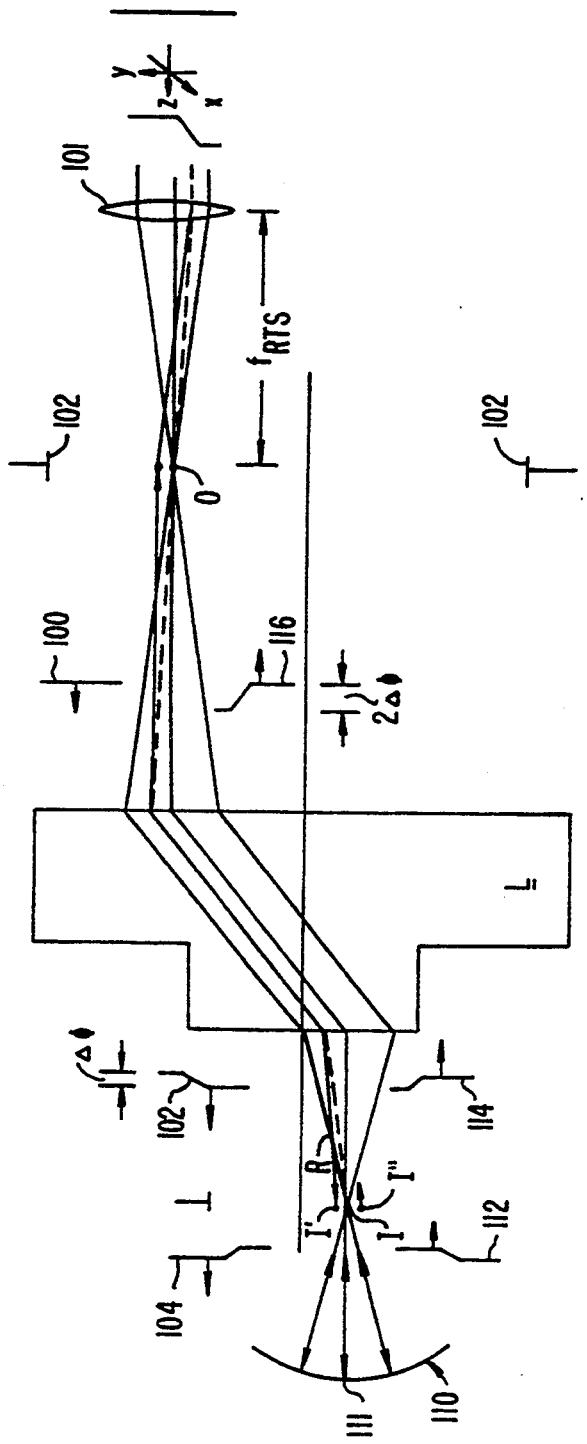

SEMICONDUCTOR DEVICE

BACKGROUND OF THE INVENTION

1. Field of the Invention

The present invention relates generally to a semiconductor device and, more particularly, to a lead-on-chip (LOC) where leads are laid out on a semiconductor chip.

2. Description of the Background Art

FIG. 6 is a perspective view illustrating a semiconductor device based on a conventional lead-on-chip structure, and FIG. 7 is a cross-sectional view of a simplified structure of FIG. 6. This semiconductor device is constructed so that inner leads 2a, 2b, 3a, 3b are bonded onto an upper surface of a chip 1 by use of bonding adhesive. A plurality of bonding pads 5 are arranged substantially in one row at the central portion of the upper surface of the chip 1. The inner leads 2a, 2b are used as lines for supplying power. The inner leads 2a, 2b extend in an arranging direction of the plurality of bonding pads 5 at the central portion of the chip 1, with the plurality of bonding pads 5 interposed therebetween. The inner leads 3a, 3b are employed as signal lines for transferring signals and each extend outwardly of the inner leads 11a, 11b. These inner leads 2a, 2b, 3a, 3b are connected at inner ends thereof via bonding wires 20, 22 to the bonding pads 5 corresponding thereto. Accordingly, the bonding wires 22 through which the inner leads 3a, 3b are connected to the bonding pads 5 are, as illustrated in FIG. 7, extended astride of the inner leads 2a, 2b for the power supply lines.

An insulating layer 25 is provided between the inner leads 2a, 2b and 3a, 3b. Thus constructed semiconductor device is normally molded with a resin to form a resin mold body 30. Lead portions projected from this resin mold body 30 are called outer leads 4.

According to the semiconductor device based on the above-mentioned lead-on-chip (hereinafter abbreviated to LOC) structure, there is no necessity for providing, outside the chip, the lead parts 2a, 2b, 3a, 3b for connecting the bonding wires led from the pads 5 on the chip 1. This therefore yields such an advantage that large-sized chip having its chip size approximate to a package size can be packaged.

As shown in FIG. 7, however, the bonding wires 22 for connecting the inner leads 3a, 3b to the pad 5 is extended astride of the power supplying inner leads 2a, 2b. It is therefore required that distance b between the bonding wire 22 and the inner leads 2a, 2b be made sufficiently in consideration of a deformation of the bonding wire 22 during the resin molding. It is also required that a distance between the bonding wire 22 and a molded resin boundary be made not to extrude the bonding wire 22 out of the resin. Under such circumstances, the conventional semiconductor device shown in FIGS. 6 and 7 presents a defect of being unsuited to a package having a small thickness of the resin because of the necessity for having a sufficient resin thickness (a+b) above the power supplying inner leads 2a, 2b.

SUMMARY OF THE INVENTION

Accordingly, it is a primary object of the present invention to provide a semiconductor device based on a lead-on-chip structure which is capable of reducing the thickness of the resin to the greatest possible degree.

In the semiconductor device according to the present invention, there is provided a semiconductor device comprising:

a semiconductor chip having a plurality of bonding pads arranged on the periphery thereof;

a power-oriented lead extending from the exterior of said semiconductor chip, passing through between said bonding pads and reaching onto said semiconductor chip, said lead including a traversing part disposed along one side of said semiconductor chip substantially at the central portion of said semiconductor chip and fixedly bonded onto the surface of said semiconductor chip;

signal leads extending from the exterior of said semiconductor chip, passing thought between said bonding pads and reaching onto said semiconductor chip, said leads being arranged so that inner ends thereof are positioned on said semiconductor chip without intersecting said power supply lead and fixedly bonded to the surface of semiconductor chip;

connection means for connecting said power supply lead and said signal leads to said bonding pads corresponding thereto; and a resin mold body for resin-sealing said respective elements.

In the semiconductor device according to the present invention, bonding pads are arranged on the periphery of the semiconductor chip and power supply inner leads are disposed inwardly of signal inner leads. Hence, bonding wires for connecting the signal lead to signal pads corresponding thereto do not extend astride of the power supply inner lead. A package of a semiconductor device can be thereby thinned as much as possible.

Further, the bonding wires do not intersect the lead frame, and, therefore, the present invention is easily applicable to a case where the pads are connected directly to leads, in for example, TAB (Tape Automated Bonding) using bumps.

BRIEF DESCRIPTION OF THE DRAWINGS

Other objects and advantages of the present invention will become apparent during the following discussion in conjunction with the accompanying drawings, in which:

FIG. 4 is a plan view showing a third embodiment;

FIG. 5 is a plan view showing a fourth embodiment;

DESCRIPTION OF THE PREFERRED EMBODIMENTS

Figure 1:
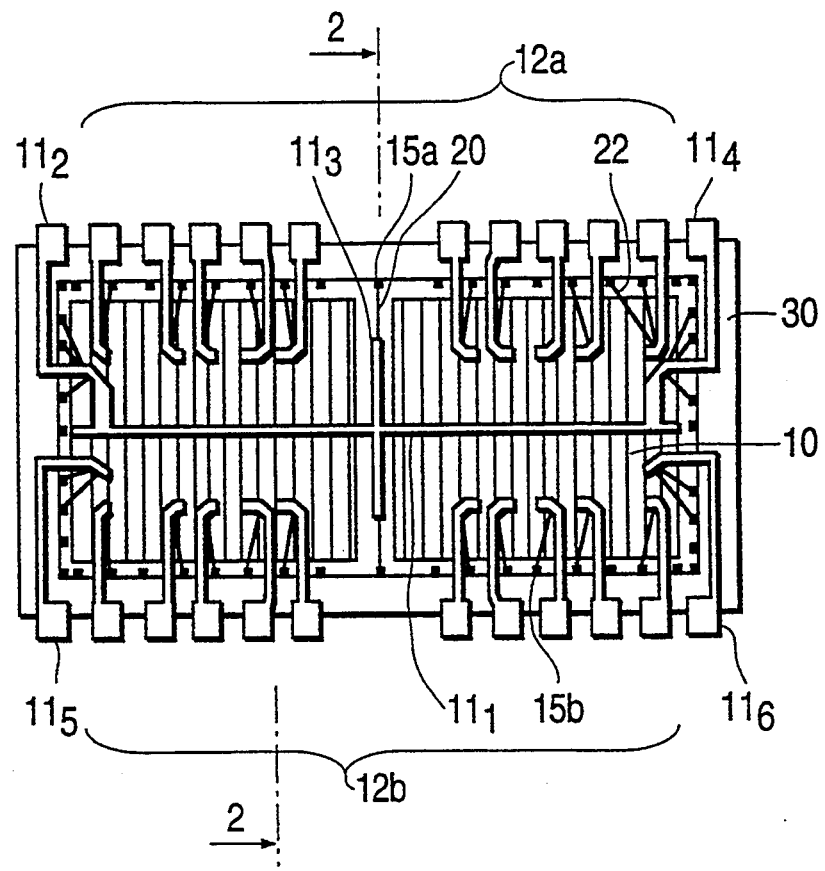
FIG. 1 is a plan view illustrating a construction of a first embodiment of a semiconductor device according to the present invention.
Figure 2:
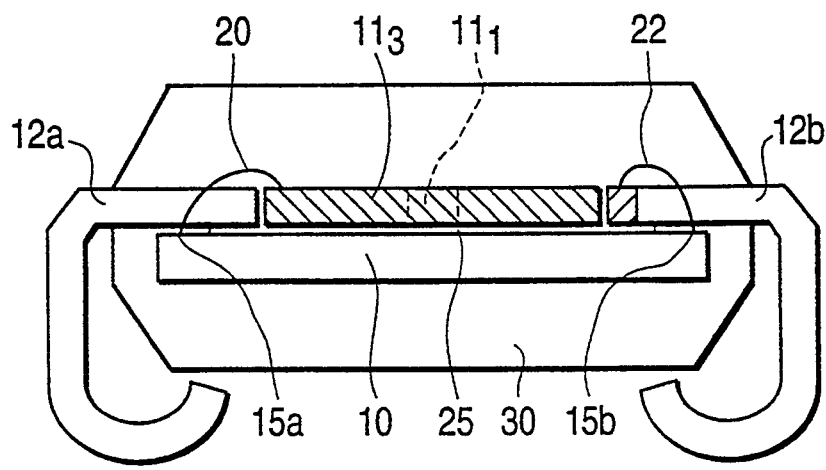
FIG. 2 is a cross-sectional view taken substantially along the line A—A of FIG. 1.

FIG. 1 is a plan view showing a first embodiment of a semiconductor device according to the present invention. FIG. 2 is a cross-sectional view taken substantially along the line A—A of FIG. 1. The semiconductor device in this embodiment includes a semiconductor chip having bonding pads 15a for power supply and bonding pads 15b for signals on the periphery thereof. There are provided inner leads $11_1$–$11_6$ for power supply and signal inner leads 12a and 12b which pass through the pads from the outside of the chip to reach inside the chip. The inner lead $11_1$ for supplying power to various part of the chip 10 extends along one side of the chip 10 at the center of the chip 10 so as to traverse the chip 10. Then, the inner leads 12a are disposed in one region (upper region in FIG. 1) of two regions into which the chip 10 is partitioned by the inner lead 11. The inner lead 12b is disposed in the other region (lower region in FIG. 1).

The inner lead $11_1$ has two cross parts $11_3$ at its center. Pins $11_2$, $11_4$ are connected to both ends of the inner lead $11_1$. The power supply pads 15a disposed on the periphery of the chip 10 are connected via bonding wires 20 to the cross part $11_3$ of the power supply inner lead $11_1$. Though in this embodiment, the cross parts extend at right angles to the the direction of inner lead $11_1$, in arbitrary angle can be used.

The signal pads 15b are connected via bonding wires 22 to the inner leads 12a, 12b for the signal lines. Layer 25 composed of an insulating material is provided between the chip 10 and the inner leads $11_1$–$11_6$, 12a, 12b. The LOC structure semiconductor device described above is normally molded with a resin 30. In the other region of the chip (in the lower side region in FIG. 1), two inner leads $11_5$ and $11_6$ for power supply are provided at the end portion of the region. Incidentally, at least one of the two inner leads $11_5$ and $11_6$ for power supply is supplied power which is different from the power supply for the inner lead $11_1$–$11_4$. Power supply inner leads can be disposed at positions other than the endmost position of sides.

In the semiconductor device according to this embodiment, the bonding wires 20, 22 are not extended astride of the power supply inner lead $11_1$ at all. Therefore the thickness of a package can be thereby reduced to the greatest possible degree.

Though the pin $11_4$ is connected to the one end of the power supply inner lead $11_1$ is disposed upper right part in FIG. 1, it may be provided in a right central position where the inner lead 11 is extended in the embodiment discussed above.

Figure 3:
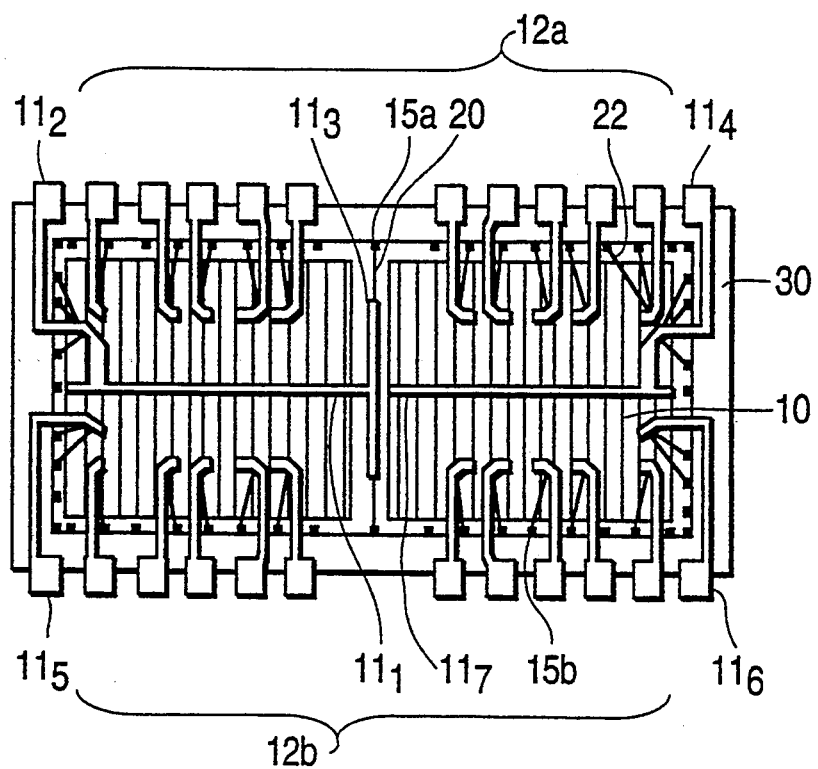
FIG. 3 is a plan view showing a second embodiment.
Figure 6:
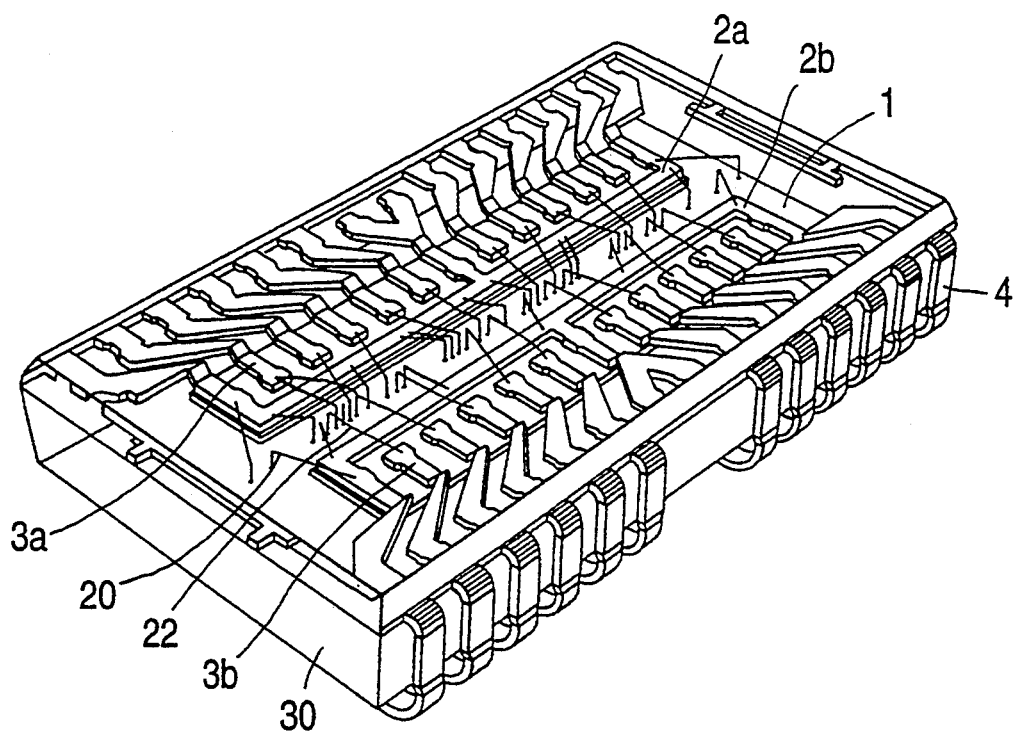
FIG. 6 is a plan view illustrating a conventional semiconductor device.
Figure 7:
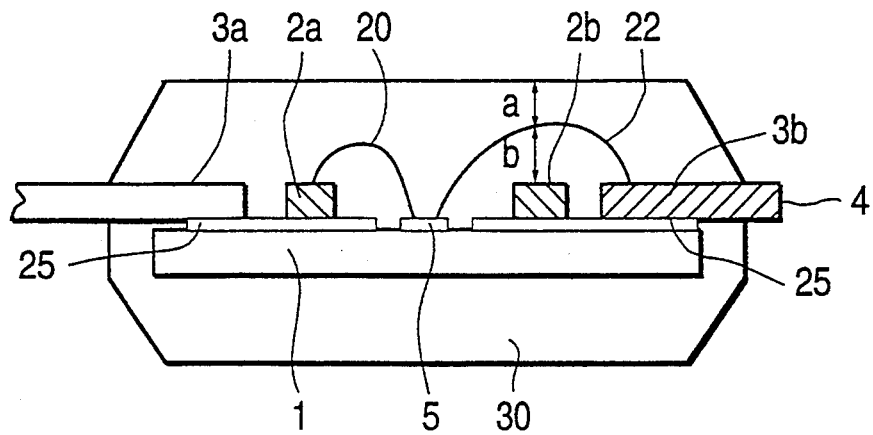
FIG. 7 is a cross-sectional view illustrating the conventional semiconductor device.

FIG. 3 is a plan view showing a second embodiment of the semiconductor device according to the present invention. In this embodiment, almost all structure is the same as that of in the first embodiment except for that the power supply inner lead $11_1$ is divided into two parts $11_1$ and $11_7$. The cross part $11_3$ is connected to inner lead $11_1$.

FIG. 4 is a plan view showing a third embodiment of the semiconductor device according to the present invention. In this embodiment, one additional inner lead is extended along the power supply lead at the center of the chip 10 of the semiconductor device shown in FIG. 1. That is, two pieces of inner leads 11a, 11b for the power lines are provided at the central portion of the chip 10 so as to partition the chip 10. One of these inner leads is employed for driving the power supply, while the other is used for a ground connection Crossing Parts $11a_1$. $11b_2$ are connected but extended orthogonally outward from the centers of these inner leads 11a, 11b. The respective parts $11a_1$, $11b_2$ are connected via the bonding wires 20 to the power supply pads provided on the periphery of the chip 10.

The semiconductor device in the third embodiment is also capable of obtaining the same effects as those of the semiconductor device in the first embodiment.

FIG. 5 is a plan view illustrating a fourth embodiment of the semiconductor device according to this invention. The semiconductor device in this embodiment is a version where the LOC structure is applied to a ZIP (zig-zag in-line package) type. The power supply inner lead 11 is extended along one side (e.g., major side) of the chip 10 substantially at the central portion of the chip i so as to traverse the chip 10. Then, this inner lead 11 is formed with a cross part $11_1$ substantially at its center. Pins $11_2$, $11_3$ for applying the power supply so provided at both ends of the inner lead 11 as to extend substantially at right angles to the direction in which the inner lead 11 extends. The cross part $11_8$ is connected via the bonding wires 20 to power supply pads provided in predetermined positions (substantially at the centers of the sides parallel to the major side of the chip 10) on the periphery of the chip 10. Signal inner leads 12a are extended in a region defined by the pins $11_2$, $11_3$ and the inner lead 11 of the chip 10. Signal inner leads 12b are arranged outwardly of the sides parallel to, e.g., a minor side of the chip 10. Then, the inner leads 12a. 12b are connected to the signal pads of the chip 10 through bonding wires 22a, 22b without extending astride of the power supply inner lead 11. Note that at least one of the plurality of signal inner leads 12a, 12b is employed for another power supply (e.g., ground level) different from the power supply connected to the inner lead 11 in accordance with the fourth embodiment. Further, two pieces of inner leads 12a closest to the pins $11_2$, $11_3$ of the inner lead 11 may be used for another power supply leads described above and connected on the chip 10 along the inner lead 11.

Moreover, the leads 12b of FIG. 5 is disposed externally of the chip but can be connected to the on-the-chip pads on the chip via the bonding wires 22b by further, if there is enough space for the leads on the chip, extending the lead frame 12b inwardly of the chip.

In accordance with the fourth embodiment, the package can also be thinned as much as possible as done in the first to third embodiments.

It is apparent that this invention may be practiced or embodied in still other ways without departing from the spirit and scope of the invention.

What is claimed is:

1. A lead-on-chip (LOC) structure semiconductor device comprising:
   a semiconductor chip having a plurality of bonding pads arranged on the periphery thereof;
   a power supply lead extending from an exterior of said semiconductor chip and reaching onto said semiconductor chip by running through a space between two neighboring bonding pads of said bonding pads on at least one side of said semiconductor chip, said power supply lead including a traversing part disposed along one side of said semiconductor chip and fixedly bonded onto the surface of said semiconductor chip;
   signal leads extending from the exterior of said semiconductor chip and running through the space between the two neighboring bonding pads on at least one side of said semiconductor chip, said signal leads being arranged so that inner ends thereof are positioned on said semiconductor chip without intersecting said power supply lead and fixedly bonded to the surface of said semiconductor chip;
   bonding wires for connecting said power supply lead and said signal leads to said bonding pads corresponding thereto without intersecting said power supply lead and said signal leads; and a resin mold body for resin-sealing said respective elements.

2. The LOC structure semiconductor device of claim 1, wherein said traversing part is extended along a major side of said semiconductor chip substantially over a length of said major side.

3. The LOC structure semiconductor device of claim 2, wherein said traversing part is connected to said power supply leads provided at both ends of the major side of said semiconductor chip.

4. The LOC structure semiconductor device of claim 3, wherein said power supply leads are provided at both ends of two face-to-face major sides of said semiconductor chip, and said traversing part is connected to said power supply leads provided along said same major side thereof.

5. The LOC structure semiconductor device of claim 4, wherein said power supply lead connected to said traversing part and another power supply lead belong to different power systems.

6. The LOC structure semiconductor device of claim 1, wherein inner ends of said signal leads are bent in a direction where said bonding pads connected thereto exist.

7. The LOC structure semiconductor device of claim 1, wherein said traversing part consists of a plurality of sub-parts disposed along the major side of said semiconductor chip.

8. The LOC structure semiconductor device of claim 1, wherein said traversing part includes a line bearing in a predetermined angle direction at a point thereof.

9. The LOC structure semiconductor device of claim 1, wherein said signal leads connected to said bonding pads on a major side of said semiconductor chip and said signal leads connected to said bonding pads on a minor side of said semiconductor chip are led out from one side of said resin mold body.

10. The LOC structure semiconductor device of claim 1, wherein said inner leads pass through between said bonding pads from exterior onto the semiconductor chip.

11. A lead-on-chip (LOC) structure semiconductor device, comprising:

a semiconductor chip having a plurality of bonding pads arranged on the periphery thereof;

a power supply lead extending from an exterior of said semiconductor chip and reaching onto said semiconductor chip by running through a space between two neighboring bonding pads of said bonding pads on at least one side of said semiconductor chip, said power supply lead including a traversing part disposed along one side of said semiconductor chip and fixedly bonded onto the surface of said semiconductor chip;

signal leads extending from the exterior of said semiconductor chip and running through the space between the two neighboring bonding pads on at least one side of said semiconductor chip, said signal leads being arranged so that inner ends thereof are positioned on said semiconductor chip without intersecting said power supply lead and fixedly bonded to the surface of said semiconductor chip;

bonding wires for connecting said power supply lead and said signal leads to said bonding pads corresponding thereto without intersecting said power supply lead and said signal leads; and a resin mold body for resin-sealing said respective elements, said traversing part having a line bearing a predetermined angle at a point thereof, said line being connected to said power supply bonding pad existing at a center on major sides of said semiconductor chip.

12. A lead-on-chip (LOC) structure semiconductor device, comprising:

a semiconductor chip having a plurality of bonding pads arranged on the periphery thereof;

a power supply lead extending from an exterior of said semiconductor chip and reaching onto said semiconductor chip by running through a space between two neighboring bonding pads of said bonding pads on at least one side of said semiconductor chip, said power supply lead including a traversing part disposed along one side of said semiconductor chip and fixedly bonded onto the surface of said semiconductor chip, said traversing part including a plurality of lines disposed in parallel at a central portion and respectively connected to said power supply leads provided at both ends of respective major sides of said semiconductor chip;

signal leads extending from the exterior of said semiconductor chip and running through the space between the two neighboring bonding pads on at least one side of said semiconductor chip, said signal leads being arranged so that inner ends thereof are positioned on said semiconductor chip without intersecting said power supply lead and fixedly bonded to the surface of the semiconductor chip;

bonding wires for connecting said power supply lead and said signal leads to said bonding pads corresponding thereto without intersecting said power supply lead and said signal leads; and a resin mold body for resin-sealing said respective elements.

* * * * *